US012191829B2

(12) United States Patent
Yu et al.

(10) Patent No.: US 12,191,829 B2
(45) Date of Patent: Jan. 7, 2025

(54) DIFFERENTIAL AMPLIFIER AND A DATA DRIVING DEVICE

(71) Applicant: LX SEMICON CO., LTD., Daejeon (KR)

(72) Inventors: Sang Duk Yu, Daejeon (KR); Ho Jong Park, Daejeon (KR); Tae Jun Ahn, Daejeon (KR); Sung Dae Yeo, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 18/496,025

(22) Filed: Oct. 27, 2023

(65) Prior Publication Data

US 2024/0146263 A1 May 2, 2024

(30) Foreign Application Priority Data

Oct. 27, 2022 (KR) ........................ 10-2022-0140056

(51) Int. Cl.

| | |
|---|---|
| ***H03F 3/45*** | (2006.01) |
| ***G09G 3/3291*** | (2016.01) |
| ***G09G 3/36*** | (2006.01) |

(52) U.S. Cl.

CPC ....... *H03F 3/45076* (2013.01); *G09G 3/3291* (2013.01); *G09G 3/3685* (2013.01); (Continued)

(58) Field of Classification Search

CPC ......... H03F 2200/294; H03F 2200/372; H03F 2200/451; H03F 2200/18; H03F 2200/447; H03F 2200/111; H03F 2200/63; H03F 3/45183; H03F 3/45475; H03F 3/195; H03F 3/45179; H03F 3/72; H03F 3/45188; H03F 3/68; H03F 3/45192; H03F 1/3211; H03F 1/26; H03F 1/0266; G09G 2330/021; G09G 2310/0289; G09G 2310/0291; G09G 2310/0248; G09G 2310/027; G09G 2310/0294; G09G 2310/0205; G09G 2310/0281; G09G 3/3688; G09G 3/3648; G09G 3/3696; G09G 3/3685; G09G 3/20; G09G 3/3677; G09G 3/36;

(Continued)

(56) References Cited

U.S. PATENT DOCUMENTS

| | | | | |
|---|---|---|---|---|
| 7,863,982 | B2 | 1/2011 | Chen et al. | |
| 2005/0285676 | A1* | 12/2005 | Jones ................... | H03F 3/3022 330/255 |

(Continued)

OTHER PUBLICATIONS

Extended European Search Report issued for the European Patent Application No. 23205992.3 on Apr. 2, 2024, 15 pages.

(Continued)

*Primary Examiner* — Dong Hui Liang

(74) *Attorney, Agent, or Firm* — ROTHWELL, FIGG, ERNST & MANBECK, P.C.

(57) ABSTRACT

A differential amplifier according to an embodiment can be provided in a data driving device for driving pixels of a display panel. The differential amplifier can improve the slew rate of the differential amplifier by supplying dynamic current to an input circuit stage and/or a current mirror circuit stage of the differential amplifier through a boosting circuit stage.

18 Claims, 8 Drawing Sheets

(52) U.S. Cl.
CPC ................. *G09G 2310/027* (2013.01); *G09G 2310/0289* (2013.01); *G09G 2310/0291* (2013.01); *G09G 2310/06* (2013.01); *G09G 2330/021* (2013.01)

(58) Field of Classification Search
CPC ..... G09G 2320/0626; G09G 2360/144; G09G 2300/0456; G09G 2340/0428; G09G 2340/10
See application file for complete search history.

(56) References Cited

U.S. PATENT DOCUMENTS

| | | | | |
|---|---|---|---|---|
| 2007/0035487 | A1* | 2/2007 | Ryu | G09G 3/3233 345/76 |
| 2008/0019159 | A1* | 1/2008 | Song | G09G 3/3688 363/62 |
| 2009/0091388 | A1* | 4/2009 | Yu | H03F 3/3023 330/255 |
| 2022/0238081 | A1 | 7/2022 | Jung et al. | |
| 2022/0383823 | A1* | 12/2022 | Lee | G09G 3/3275 |

OTHER PUBLICATIONS

Kim et al. "Slew-rate-enhanced rail-to-rail buffer mplifier for TFT LCD data drivers," Electronics Letters, The Institution of Engineering and Technology, GB, 2012, vol. 48 No. 15, pp. 924-925.

Choi et al., "56.5: High-Speed and Low-Power Analog Source Driver for TFT-LCD Using Dynamic Current Biased Operational Amplifier," SID 2007, 2007 SID International Symposium, Society for Information Display, Los Angeles, US, vol. XXXVIII, 2007, pp. 1647-1649.

* cited by examiner

DIFFERENTIAL AMPLIFIER AND A DATA DRIVING DEVICE

CROSS-REFERENCE TO RELATED APPLICATIONS

The present application claims the benefits of priority to Korean Patent Application No. 10-2022-0140056, filed on Oct. 27, 2022, which is incorporated herein by reference in its entirety.

BACKGROUND OF THE DISCLOSURE

Field

An embodiment relates to a differential amplifier and a data driving device.

Discussion of the Related Art

The display panel includes a plurality of pixels. The display panel includes a liquid crystal display (LCD) panel, an organic light emitting diode (OLED) panel, etc. Each of pixels of the LCD panel controls its brightness using a backlight and liquid crystal. Each of pixels of OLED panel includes self-luminous elements, and the brightness is adjusted by adjusting the amount of power flowing to the self-luminous elements.

Meanwhile, the display device includes a display panel and a driving device that can adjust the brightness of each pixel of the display panel. The driving device controls the brightness of each pixel by controlling the degree of opening and closing of the liquid crystal in the LCD panel or the amount of power supplied to the self-luminous element in the OLED panel.

The driving device supplies a data voltage corresponding to the grayscale value of each pixel to each pixel. Each pixel can adjust the degree of opening and closing of the liquid crystal or the amount of power supplied to the self-luminous element depending on the data voltage. In terms of supplying data voltage, the above-described driving device is also called a data driving device.

Meanwhile, each pixel includes a driving transistor. In terms of the data voltage being supplied to the source terminal of the driving transistor, the data driving device is also called a source driver. In addition, in terms of one channel driving a plurality of pixels forming one vertical line, the data driving device is also called a column driver.

The data driving device can drive one line per horizontal line every predetermined horizontal times. For example, the data driving device can drive the pixels of a first horizontal line during a first horizontal time and drive the pixels of a second horizontal line during a second horizontal time following the first horizontal time.

The data driving device can change the size of the data voltage supplied to the display panel according to the gray level value of each pixel of each horizontal line at one point in each horizontal time. For example, the data driving device supplies the first data voltage to the display panel during the first horizontal time, and then changes the first data voltage to the second data voltage at the start of the second horizontal time to supply the second data voltage to the display panel.

The data driving device can receive image data from the data processing device. The image data can comprise pixel data representing the grayscale value of each pixel. The data driving device can convert pixel data into analog voltage and amplify the analog voltage to generate a data voltage.

The data driving device can use a differential amplifier to amplify the analog voltage and generate a data voltage. In this structure, the quality of the image implemented on the display panel can be greatly affected by the slew rate of the differential amplifier. If the slew rate is low, the grayscale of the pixel may not reach the desired level within a given time, and the response characteristics of the display panel can be lowered.

SUMMARY OF THE DISCLOSURE

Against this background, an object of the embodiment is, in one aspect, to provide a technique for improving the response characteristics of a display panel through improvements to a data driving device. In another aspect, an objective of the embodiment is to provide a technique for improving the slew rate of a differential amplifier that can be used in a data drive device.

According to one aspect of the embodiment for achieving the above-described object, a differential amplifier, comprising: an output circuit stage comprising a first output transistor disposed between a first voltage rail and the output side, and a second output transistor disposed between a second voltage rail and the output side; an input circuit stage configured to generate differential currents according to differential input voltages; a current minor circuit stage configured to control gate terminals of the first output transistor and the second output transistor according to the differential currents; and a boosting circuit stage configured to additionally supply dynamic current to the input circuit stage in response to changes in the differential input voltages.

The input circuit stage can comprise a differential amplification circuit having a common source structure and configured to input differential input voltages to gate terminals, and the boosting circuit stage can supply the dynamic current to a common source terminal of the differential amplification circuit.

The differential amplifier can comprise a bias current source configured to supply bias current to the common source terminal. The bias current source and the boosting circuit stage can supply current to the common source terminal in parallel.

According to another aspect of the embodiment, a differential amplifier, comprising: an output circuit stage comprising a first output transistor disposed between a first voltage rail and the output side, and a second output transistor disposed between a second voltage rail and the output side; an input circuit stage configured to generate differential currents according to differential input voltages; a current mirror circuit stage configured to control gate terminals of the first output transistor and the second output transistor according to the differential currents; and a boosting circuit stage configured to additionally supply dynamic current to the current mirror circuit stage in response to changes in the differential input voltages.

The current mirror circuit stage can comprise a first current minor circuit connected to the first voltage rail that supplies a first driving voltage and a second current mirror circuit connected to the second voltage rail that supplies a second driving voltage. The boosting circuit stage can supply the dynamic current to the first current minor circuit or supply the dynamic current to the second current minor circuit according to the polarity of a differential voltage between the differential input voltages.

According to another aspect of the embodiment, a data driving device, comprising: a latch circuit configured to latch pixel data comprising grayscale values for pixels; a digital-to-analog converter configured to convert a digital signal corresponding to the pixel data into an analog voltage; and a buffer circuit comprising a rail-to-rail class-AB type amplifier, and configured to supply a data voltage obtained by amplifying the analog voltage using the amplifier to the pixel, and additionally supply dynamic current to an input circuit stage or a current mirror circuit stage of the amplifier in response to changes in the analog voltage.

The current mirror circuit stage can comprise a first current mirror circuit connected to a first voltage rail that supplies a first driving voltage and a second current minor circuit connected to a second voltage rail that supplies a second driving voltage. The buffer circuit can supply the dynamic current to the second current mirror circuit when the analog voltage has a rising waveform, and supplies the dynamic current to the first current mirror circuit when the analog voltage has a falling waveform.

As described above, according to the embodiment, the response characteristics of the display panel can be improved through improvements to the data driving device. According to an embodiment, the slew rate of a differential amplifier that can be used in a data driving device can be improved. According to an embodiment, a differential amplifier having a high-speed slew rate can be provided without adding static power. According to an embodiment, a differential amplifier can be provided in which the phenomenon of overshooting and undershooting is improved in the range of linear operation. According to an embodiment, a differential amplifier that performs an effective slew boosting function can be provided by adding a simple circuit.

BRIEF DESCRIPTION OF THE DRAWINGS

FIG. 6 is a diagram showing a current state of the differential amplifier for a rising waveform when the boosting circuit stage according to the embodiment is turned on.

FIG. 8 is a diagram showing a current state of the differential amplifier for the falling waveform when the boosting circuit stage according to the embodiment is turned on.

DETAILED DESCRIPTION OF EMBODIMENTS

Figure 1:
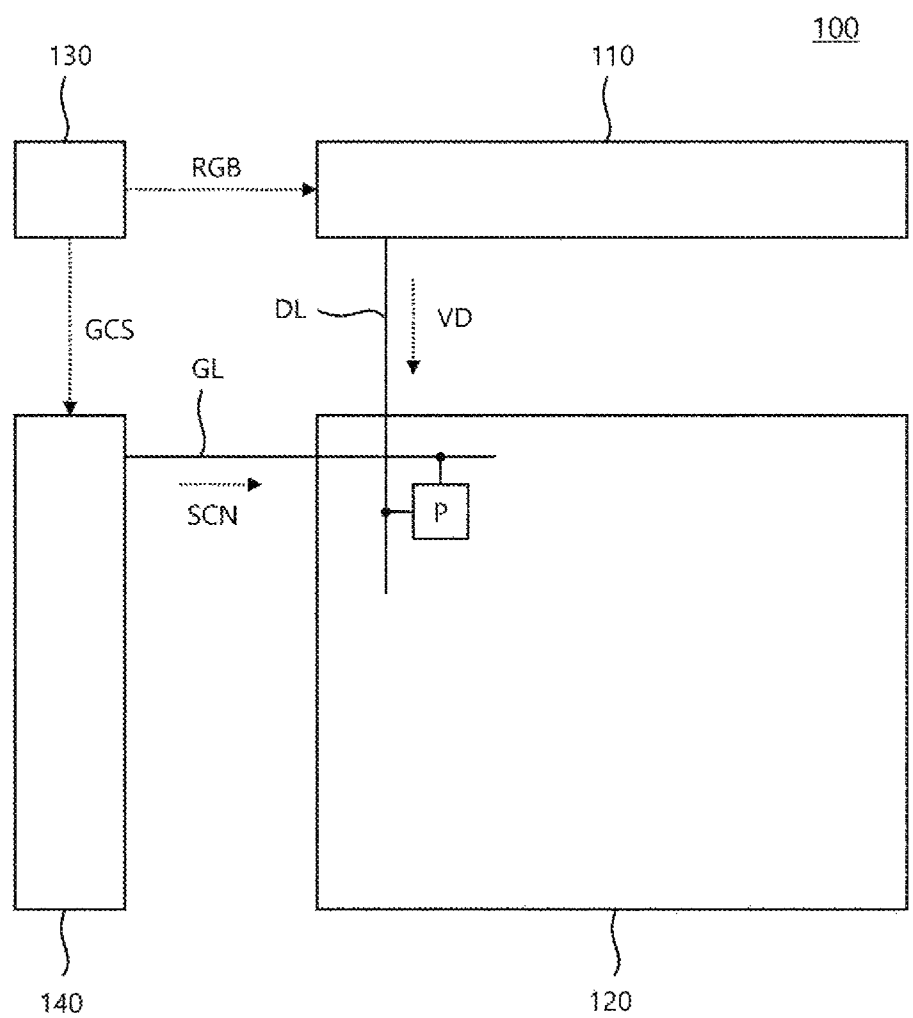
FIG. 1 is a configuration diagram of a display device according to an embodiment.

FIG. 1 is a configuration diagram of a display device according to an embodiment.

Referring to FIG. 1, the display device 100 can comprise a display panel 120, a data processing device 130, a gate driving device 140, and a data driving device 110.

The display panel 120 can be an LCD panel or a self-luminous panel such as an OLED panel.

When the display panel 120 is an LCD panel, the display panel 120 can comprise a backlight, liquid crystal, and a common electrode. Each pixel P can comprise a pixel electrode and a driving transistor. When a scan signal SCN is supplied to a gate terminal of the driving transistor, the driving transistor can be turned on and a data voltage can be supplied to the pixel electrode. Depending on the data voltage, an electric field can be formed between the pixel electrode and the common electrode, and the alignment direction of the liquid crystal can change. Accordingly, the degree of transmission of light supplied from the backlight can be changed, and the brightness of the pixel P can be adjusted.

A plurality of data lines DL and a plurality of gate lines GL can be arranged in a matrix form on the display panel 120. The data line DL can be connected to a source terminal of the driving transistor of each pixel P, and the gate line GL can be connected to the gate terminal of the driving transistor of each pixel P. When the scan signal SCN is supplied to the gate line GL, the driving transistor can be turned on and the data voltage VD supplied through the data line DL can be transmitted to the pixel electrode.

A parasitic capacitor can be formed in the data line DL. The parasitic capacitor can be formed between the data line DL and the common electrode or between the data line DL and the pixel electrode. From the perspective of the data driving device 110 that supplies the data voltage VD, the parasitic capacitor can be recognized as a load. The larger the capacity of the parasitic capacitor, the more power the data driving device 110 must supply to the data line DL, which can increase power consumption.

The display panel 120 can be a self-luminous panel such as an OLED panel. In addition to the OLED panel, self-luminous panel can also use other types of self-luminous devices such as a micro-LED panel.

Each pixel P of the OLED panel can comprise a scan transistor, a driving transistor, an OLED element, etc. When the scan signal SCN is supplied to a gate terminal of the scan transistor, the scan transistor can be turned on and the data voltage VD can be supplied to the driving transistor through the scan transistor. In the OLED panel, the data voltage VD can be supplied to the gate terminal of the driving transistor. The size of the conduction current of the driving transistor can be determined depending on the size of the data voltage VD, and the brightness of the OLED connected to the driving transistor can be adjusted depending on the size of the conduction current of the driving transistor.

A plurality of data lines DL and a plurality of gate lines GL can be arranged in a matrix form on the display panel 120. The data line DL can be connected to the source terminal of the scan transistor of each pixel P, and the gate line GL can be connected to the gate terminal of the scan transistor of each pixel P. When the scan signal SCN is supplied to the gate line GL, the scan transistor can be turned on and the data voltage VD supplied through the data line DL can be transmitted to the driving transistor.

A parasitic capacitor can be formed in the data line DL. The parasitic capacitor can be formed between the data line DL and the cathode electrode of the OLED panel or between the data line DL and the anode electrode of the OLED panel. From the perspective of the data driving device 110 that supplies the data voltage VD, the parasitic capacitor can be recognized as a load. The larger the capacity of the parasitic capacitor, the more power the data driving device 110 must supply to the data line.

The data processing device 130 can receive image data from an external device—for example, a host or a device called an application processor (AP). The data processing device 130 can convert image data having a format of the external device into image data RGB having a format that the data driving device 110 can process. The data processing device 130 can transmit the converted image data RGB to the data driving device 110.

The image data RGB can comprise pixel data representing grayscale values for a plurality of pixels P. The pixel data for one pixel P has, for example, 8 bits and can express grayscale values from 0 to 255, but is not limited thereto. The data processing device 130 can generate pixel data for each pixel P, include the pixel data in the image data RGB, and transmit the image data RGB to the data driving device 110.

The data processing device 130 can transmit control signals DCS and GCS to devices involved in driving the display panel 120—for example, the data driving device 110 and the gate driving device 140. The data processing device 130 can transmit a data control signal DCS to the data driving device 110 and a gate control signal GCS to the gate driving device 140.

The control signals DCS and GCS can comprise setting information for each device 110 and 140. For example, the data processing device 130 can receive setting information from an external device, check the setting information for each device, and then transmit the setting information by comprising it in the corresponding control signal DCS or GCS.

The control signals DCS and GCS can comprise timing signals for controlling each device 110 and 140. The timing signals can comprise, for example, a vertical synchronization signal Vsync, a horizontal synchronization signal Hsync, etc. The data driving device 110 or the gate driving device 140 can distinguish frames and each horizontal time according to the timing signal. In terms of controlling the timing of each device 110 and 140, the data processing device 130 is also called a timing controller.

The gate driving device 140 can supply a scan signal SCN to the pixels P of the display panel 120. The pixels P to which a scan signal SCN for turn-on is supplied can be selected, and the data voltage VD can be supplied to the selected pixels P.

The gate driving device 140 can supply the scan signal SCN through the gate line GL. A plurality of gate lines GL can be disposed on the display panel 120. Each gate line GL can be connected to pixels P arranged in a row in one direction (e.g., horizontal direction). The gate driving device 140 can supply a scan signal SCN for turn-on to one of the plurality of gate lines GL, so that pixels P connected to the gate line GL can be selected. The gate driving device 140 can supply a scan signal SCN for turn-on while changing the gate line GL at every horizontal time.

The data driving device 110 can drive the pixels P of the display panel 120.

The data driving device 110 can receive image data RGB from the data processing device 130. The data driving device 110 can check the pixel data for each pixel P included in the image data RGB, generate a data voltage VD corresponding to the pixel data, and supply the data voltage VD to each pixel P.

Pixel data can represent a grayscale value for each pixel P. The data driving device 110 can generate a data voltage VD corresponding to the gray level value.

The pixel data can be stored in a latch circuit of the data driving device 110 and output as a digital signal. The data driving device 110 can convert a digital signal into an analog voltage using gamma reference voltages.

There is a difference between the gradation corresponding to physical brightness and the gradation corresponding to the brightness perceived by humans. Correcting this difference is called gamma conversion. When converting a digital signal to an analog voltage, the data driving device 110 can simultaneously apply gamma conversion. For example, the data driving device 110 can simultaneously apply digital-to-analog conversion and gamma conversion by using analog voltages used for digital-to-analog conversion as voltages to which gamma conversion has been applied—gamma reference voltages—.

The analog voltage may not be suitable for driving the pixel P due to its low power level. Therefore, the data driving device 110 can amplify the analog voltage to generate the data voltage VD, and supply the data voltage VD with a relatively high level of power to the pixel P.

Figure 2:
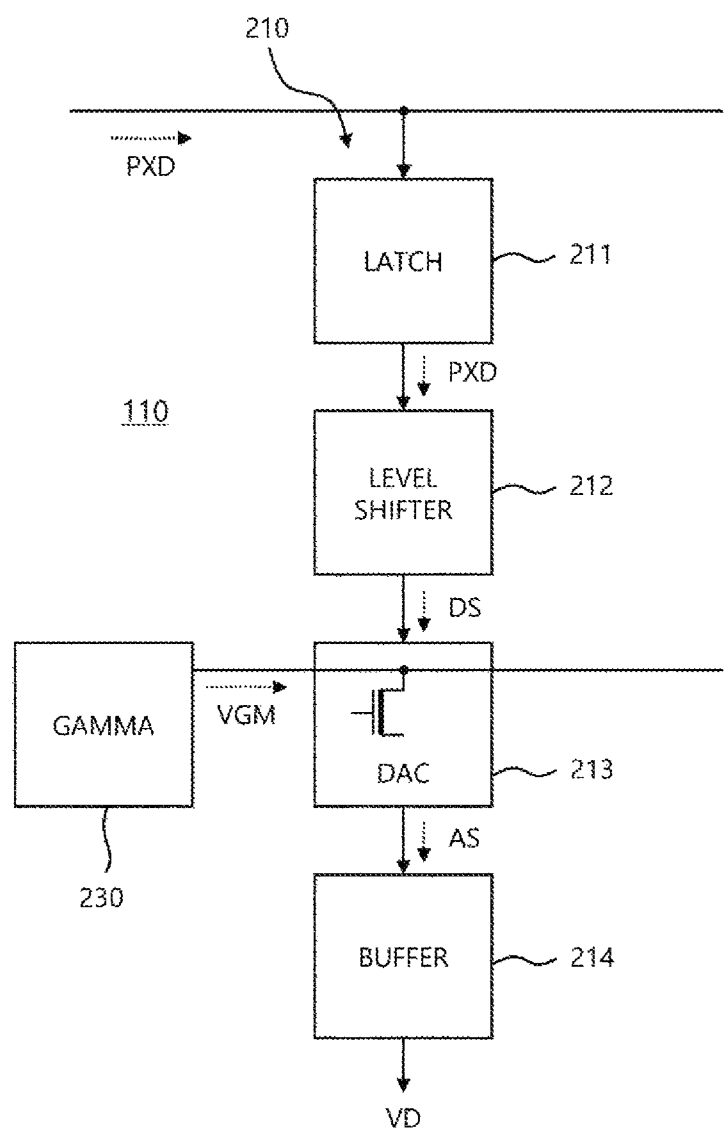
FIG. 2 is a configuration diagram of a data driving device according to an embodiment.

FIG. 2 is a configuration diagram of a data driving device according to an embodiment.

Referring to FIGS. 1 and 2, the data driving device 110 can comprise a channel circuit 210 and a gamma reference voltage generation circuit 230.

The channel circuit 210 can comprise a latch circuit 211, a level shifter 212, a digital-to-analog converter (DAC) 213, and a buffer circuit 214. The channel circuit 210 can receive pixel data PXD corresponding to the gray level value of each pixel P, generate a data voltage VD, and supply the data voltage VD to the data line connected to each pixel P.

The latch circuit 211 can sequentially store pixel data PXD received through a data bus line.

The latch circuit 211 can comprise two latches, that is, a first latch and a second latch, but is not limited thereto. The first latch can store pixel data to be output at the next horizontal time, that is, the second horizontal time, and the second latch can store pixel data to be output at the current horizontal time, that is, the first horizontal time. When the second horizontal time comes, pixel data to be output at the next horizontal time, that is, the third horizontal time, can be stored in the first latch, and the pixel data stored in the first latch can be moved to the second latch and stored in the second latch.

The output timing of the latch circuit 211 can be determined according to the latch output signal generated at each horizontal time. The latch output signal can be synchronized with the horizontal synchronization signal Hsync. Alternatively, the latch output signal can be a signal that has a different phase from the horizontal synchronization signal Hsync but has the same cycle length.

The latch circuit 211 can transfer the pixel data PXD stored in the latch circuit 211 to the level shifter 212 according to the latch output signal.

The level shifter 212 can convert pixel data PXD into a digital signal DS. The level shifter 212 can increase the signal level while converting the pixel data PXD into the digital signal DS.

The pixel data PXD can be a signal with a low level of voltage or power. The level shifter 212 can convert the pixel data PXD into a digital signal DS with a high level of voltage or power.

The DAC 213 can receive the digital signal DS and drive the gate terminals of the switches. The DAC 213 can convert a digital signal DS into an analog voltage AS by driving each switch.

The DAC 213 can comprise a plurality of switches. Depending on the on-off state, the switches can selectively connect one of a plurality of gamma reference voltage lines to which a plurality of gamma reference voltages are supplied with an output side. The voltage supplied to one selected gamma reference voltage line can be the analog voltage AS output to the output side. The digital signal DS can be supplied to the gate terminal of the switch and can change the on-off state of the switch.

The digital signal DS can be supplied to drive the gate terminal of the switch. The digital signal DS can be output from the level shifter 212. From this point of view, the load of the gate terminal of the switch can be part of the load of the output side of the level shifter 212.

The data driving device 110 can comprise a gamma reference voltage generation circuit 230 that supplies gamma reference voltages VGM to the DAC 213.

The channel circuit 210 can comprise a buffer circuit 214 connected between each output side of the DAC 213 and each pixel P.

The buffer circuit 214 can amplify each output signal of the DAC 213 and supply the output signal to the data line DL connected to each pixel P. The buffer circuit 214 can amplify the analog voltage AS to generate a data voltage VD, and supply the amplified data voltage VD to the data line DL.

The buffer circuit 214 can comprise a differential amplifier to amplify the analog voltage AS to the data voltage VD.

The differential amplifier can be a rail-to-rail class-AB type amplifier. The buffer circuit 214 can generate a data voltage VD by amplifying the analog voltage AS using a differential amplifier.

The differential amplifier can have a buffer structure with input and output connected to each other. For example, the output side of the differential amplifier can be connected to an inverting input terminal of the differential amplifier. The analog voltage AS can be supplied to a non-inverting input terminal of the differential amplifier.

Figure 3:
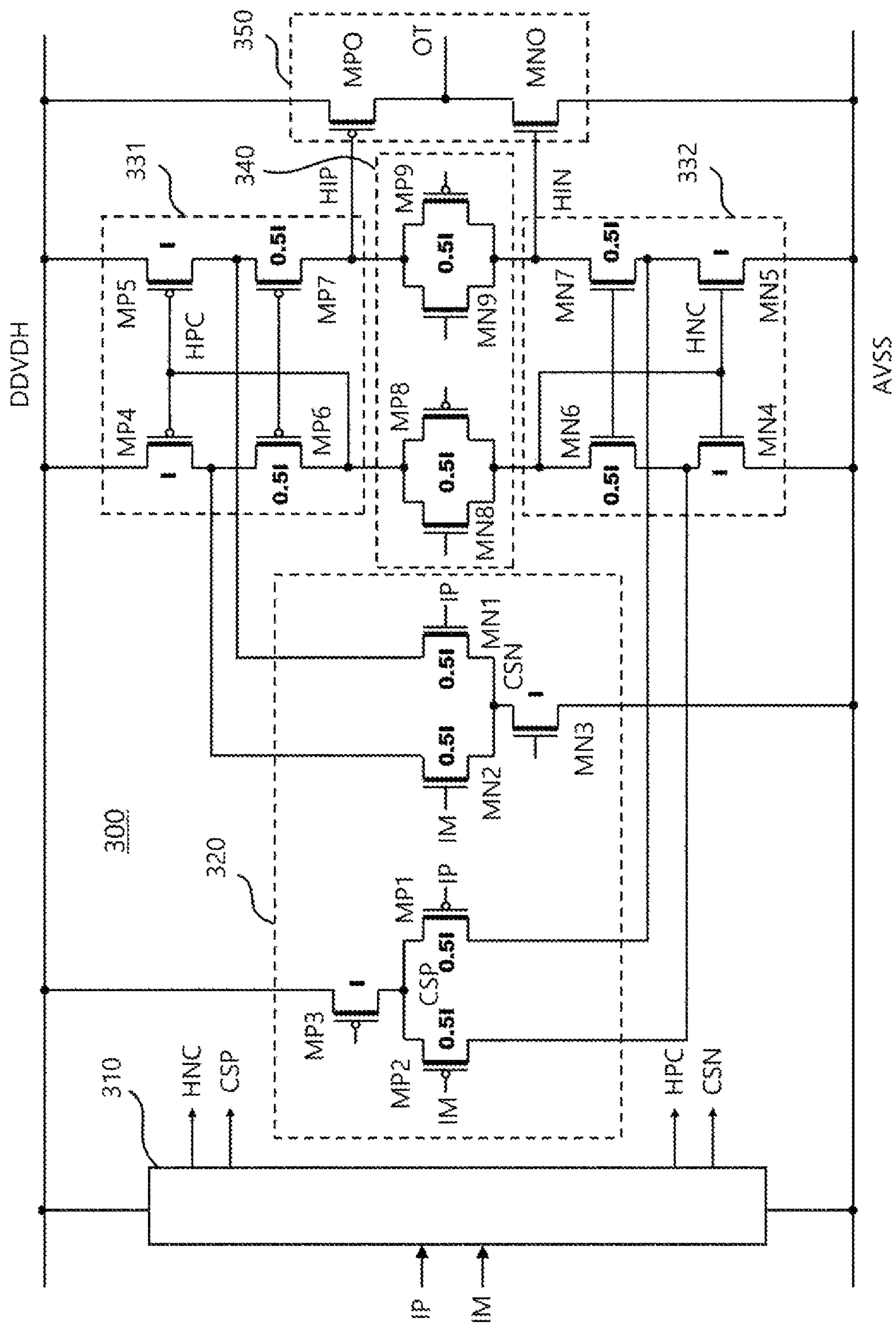
FIG. 3 is a configuration diagram of a differential amplifier according to an embodiment.

FIG. 3 is a configuration diagram of a differential amplifier according to an embodiment.

Referring to FIG. 3, the differential amplifier 300 can comprise an input circuit stage 320, a current mirror circuit stage 331 and 332, a bias circuit stage 340, an output circuit stage 350, a boosting circuit stage 310, etc.

In the differential amplifier 300, a rail-to-rail class-AB amplifier can be configured by the input circuit stage 320, the current mirror circuit stage 331 and 332, the bias circuit stage 340, and the output circuit stage 350.

The differential amplifier 300 can comprise a first voltage rail supplied with a first driving voltage DDVDH and a second voltage rail supplied with a second driving voltage AVSS. The first driving voltage DDVDH can be greater than the second driving voltage AVSS. One side of each of the input circuit stage 320, the current mirror circuit stage 331 and 332, and the output circuit stage 350 can be connected to the first voltage rail and the other side of each of the input circuit stage 320, the current mirror circuit stage 331 and 332, and the output circuit stage 350 can be connected to the second voltage rail.

The differential amplifier 300 can receive differential input voltages IP and IM and supply an output voltage OT to the outside. In the differential amplifier 300, a first differential input voltage IP can be input through a first input terminal, and a second differential input voltage IM can be input through a second input terminal. The output voltage OT can be supplied externally through the output side of the differential amplifier 300. For convenience of explanation, the reference symbol IP can be used to refer to the first differential input voltage or the first input side. The reference symbol IM can be used to refer to a second differential input voltage or a second input side. The reference symbol OT can be used to refer to the output voltage or output side. The first differential input voltage IP can be referred to as a non-inverting input voltage or the first input side can be referred to as a non-inverting input terminal. The second differential input voltage IM can be referred to as an inverting input voltage or the second input side can be referred to as an inverting input stage.

When the differential amplifier 300 functions as a buffer, the inverting input terminal can be connected to the output side. In this case, the output voltage OT can follow the waveform of the first differential input voltage IP. Depending on the slew rate of the differential amplifier 300, the speed at which the output voltage OT follows the waveform of the first differential input voltage IP can vary. The differential amplifier 300 according to the embodiment can improve the slew rate of the differential amplifier 300 by additionally supplying dynamic current through the boosting circuit stage 310. The dynamic current can be generated in response to variations in differential input voltages—in particular, the first differential input voltage IP. For example, when the first differential input voltage IP has a rising waveform or a falling waveform, dynamic current can be generated. The dynamic current may not be generated when the differential input voltages—particularly the first differential input voltage IP—are in a static state. For example, when the first differential input voltage IP maintains a constant level, the dynamic current may not be generated. Therefore, the differential amplifier 300 can improve the slew rate without consuming additional static power.

The output circuit stage 350 can comprise a first output transistor MPO disposed between the first voltage rail and the output side and a second output transistor MNO disposed between the second voltage rail and the output side. The slew rate of the differential amplifier 300 can be greatly affected by the size of the current that charges and discharges the gate terminals HIP and HIN of the first output transistor MPO and the second output transistor MNO. For example, in order to adjust the size of the current flowing into the first output transistor MPO and the second output transistor MNO in response to the dynamic waveform of the first differential input voltage IP, voltages of the gate terminals HIP and HIN of the first output transistor MPO and the second output transistor MNO can rise or fall. At this time, when the current for charging and discharging the gate terminal is large, the fluctuation of the current flowing through the first output transistor MPO and the second output transistor MNO increases, so that the slew rate can be improved.

The differential amplifier 300 according to the embodiment can have a structure in which dynamic current is additionally supplied in response to changes in differential input voltages IP and IN, and the added dynamic current provides current for charging and discharging the gate terminals HIP and HIN of the first output transistor MPO and the second output transistor MNO.

The current that charges and discharges the first output transistor MPO and the second output transistor MNO can be affected by the current of the input circuit stage 320 and the current of the current mirror circuit stage 331 and 332. The differential amplifier 300 can supply additional dynamic current to the input circuit stage 320 and/or the current mirror circuit stage 331 and 332 to increase the current for charging and discharging the first output transistor MPO and the second output transistor MNO.

The input circuit stage 320 can comprise a first differential amplification circuit and a second differential amplification circuit.

The first differential amplification circuit can comprise a first N-type transistor MN1 and a second N-type transistor MN2 having a common source structure. The source terminals of the first N-type transistor MN1 and the second N-type transistor MN2 can be connected to a second voltage rail to which the second driving voltage AVSS is supplied through the third N-type transistor MN3.

A bias voltage can be supplied to the gate terminal of the third N-type transistor MN3, and the third N-type transistor MN3 can function as a bias current source according to the bias voltage.

A first differential input voltage IP can be supplied to the gate terminal of the first N-type transistor MN1, and a second differential input voltage IM can be supplied to the gate terminal of the second N-type transistor MN2. When the first differential input voltage IP and the second differential input voltage IM are the same, a 0.5 unit current (0.5I) can flow through the first N-type transistor MN1, and a 0.5 unit current (0.5I) can flow through the second N-type transistor MN2.

When the first differential input voltage IP increases, more current can flow into the first N-type transistor MN1. Accordingly, when more current flows to the first N-type transistor MN1, more current flows to the first output transistor MPO and less current flows to the second output transistor MNO, thereby increasing the output voltage OT. When the first differential input voltage IP falls, less current can flow into the first N-type transistor MN1. Accordingly, when less current flows to the first N-type transistor MN1, less current flows to the first output transistor MPO and more current flows to the second output transistor MNO, thereby lowering the output voltage OT.

The second differential amplification circuit can comprise a first P-type transistor MP1 and a second P-type transistor MP2 having a common source structure. The source terminals of the first P-type transistor MP1 and the second P-type transistor MP2 can be connected to the first voltage rail to which the first driving voltage DDVDH is supplied through the third P-type transistor MP3.

A bias voltage can be supplied to the gate terminal of the third P-type transistor MP3, and the third P-type transistor MP3 can function as a bias current source according to the bias voltage.

A first differential input voltage IP can be supplied to the gate terminal of the first P-type transistor MP1, and a second differential input voltage IM can be supplied to the gate terminal of the second P-type transistor MP2. When the first differential input voltage IP and the second differential input voltage IM are the same, a 0.5 unit current (0.5 I) can flow through the first P-type transistor MP1, and a 0.5 unit current (0.5 I) can flow through the second P-type transistor MP2.

When the first differential input voltage IP increases, less current can flow into the first P-type transistor MP1. Accordingly, when less current flows to the first P-type transistor MP1, more current flows to the first output transistor MPO and less current flows to the second output transistor MNO, thereby increasing the output voltage OT. When the first differential input voltage IP falls, more current can flow through the first P-type transistor MP1. Accordingly, when more current flows through the first P-type transistor MP1, less current flows into the first output transistor MPO and more current flows into the second output transistor MNO, thereby lowering the output voltage OT.

The current mirror circuit stages 331 and 332 can comprise a first current mirror circuit 331 and a second current mirror circuit 332.

The first current mirror circuit 331 can comprise a first reference current transistor MP4 and a first mirroring current transistor MP5.

The first current mirror circuit 331 can have a common gate structure. The gate terminal of the first reference current transistor MP4 can be connected to the gate terminal of the first mirroring current transistor MP5.

One side of the first current mirror circuit 331 can be connected to a first voltage rail to which the first driving voltage DDVDH is supplied. The source terminal of the first reference current transistor MP4 and the source terminal of the first mirroring current transistor MP5 can be connected to the first voltage rail.

A first reference current can flow through the first reference current transistor MP4, and a mirroring current corresponding to the first reference current can flow through the first mirroring current transistor MP5.

A first additional transistor circuit having a common gate structure can be connected to the drain terminal of the first reference current transistor MP4 and the drain terminal of the first mirroring current transistor MP5.

The first additional transistor circuit can comprise a first additional transistor MP6 connected to the drain terminal of the first reference current transistor MP4 and a second additional transistor MP7 connected to the drain terminal of the first mirroring current transistor MP5. The first additional transistor MP6 can perform additional functions such as limiting the amount of current flowing to the first reference current transistor MP4. The second additional transistor MP7 can perform additional functions such as limiting the amount of current flowing to the first mirroring current transistor MP5.

To configure the first current mirror circuit 331, the gate terminal and drain terminal of the first reference current transistor MP4 can be electrically connected. In normal operation, the gate terminal of the first reference current transistor MP4 and the drain terminal of the first additional transistor MP6 can be connected so that the first additional transistor MP6 and the second additional transistor MP7 can operate as a bypass circuit.

In the first differential amplification circuit of the input circuit stage 320, the drain terminal of the first N-type transistor MN1 can be connected to the drain terminal of the first mirroring current transistor MP5. In the first differential amplification circuit, the drain terminal of the second N-type transistor MN2 can be connected to the drain terminal of the first reference current transistor MP4.

The second current mirror circuit 332 can comprise a second reference current transistor MN4 and a second mirroring current transistor MN5.

The second current mirror circuit 332 can have a common gate structure. The gate terminal of the second reference current transistor MN4 can be connected to the gate terminal of the second mirroring current transistor MN5.

One side of the second current mirror circuit 332 can be connected to a second voltage rail to which the second driving voltage AVSS is supplied. The source terminal of the second reference current transistor MN4 and the source terminal of the second mirroring current transistor MN5 can be connected to the second voltage rail.

A second reference current can flow through the second reference current transistor MN4, and a mirroring current corresponding to the second reference current can flow through the second mirroring current transistor MN5.

A second additional transistor circuit having a common gate structure can be connected to the drain terminal of the second reference current transistor MN4 and the drain terminal of the second mirroring current transistor MN5.

The second additional transistor circuit can comprise a third additional transistor MN6 connected to the drain terminal of the second reference current transistor MN4 and a fourth additional transistor MN7 connected to the drain terminal of the second mirroring current transistor MN5. The third additional transistor MN6 can perform additional functions such as limiting the amount of current flowing to the second reference current transistor MN4. The fourth additional transistor MN7 can perform additional functions such as limiting the amount of current flowing to the second mirroring current transistor MN5.

To configure the second current mirror circuit 332, the gate terminal and drain terminal of the second reference current transistor MN4 can be electrically connected. In normal operation, the gate terminal of the second reference current transistor MN4 and the drain terminal of the third addition transistor MN6 can be connected so that the third addition transistor MN6 and the fourth addition transistor MN7 can operate as a bypass circuit.

In the second differential amplification circuit of the input circuit stage 320, the drain terminal of the first P-type transistor MP1 can be connected to the drain terminal of the second mirroring current transistor MN5. In the second differential amplification circuit, the drain terminal of the second P-type transistor MP2 can be connected to the drain terminal of the second reference current transistor MN4.

The bias circuit stage 340 can be disposed between the first current mirror circuit 331 and the second current mirror circuit 332.

The bias circuit stage 340 can comprise a first bias circuit and a second bias circuit.

The first bias circuit can have a structure in which an N-type transistor MN8 and a P-type transistor MP8 are connected in parallel. The bias current supplied by the first bias circuit can be determined according to the bias voltage supplied to the gate terminals of the N-type transistor MN8 and the P-type transistor MP8.

The second bias circuit can have a structure in which an N-type transistor MN9 and a P-type transistor MP9 are connected in parallel. The bias current supplied by the second bias circuit can be determined according to the bias voltage supplied to the gate terminals of the N-type transistor MN9 and the P-type transistor MP9.

The first bias circuit can be electrically connected to the first reference current transistor MP4 of the first current mirror circuit 331 and the second reference current transistor MN4 of the second current mirror circuit 332, so that a first current path can be formed. The first current path can be referred to as a reference current path. In the reference current path, the first bias current formed by the first bias circuit can flow out to the second voltage rail through the second reference current transistor MN4 via the first voltage rail, the first reference current transistor MP4 and the first bias circuit.

The second bias circuit can be electrically connected to the first minoring current transistor MP5 of the first current minor circuit 331 and the second mirroring current transistor MN5 of the second current mirror circuit 332, so that a second current path can be formed. The second current path can be called a mirroring current path. The second bias current formed by the second bias circuit in the mirroring current path can flow to the second voltage rail through the second minoring current transistor MN5 via the first voltage rail, the first mirroring current transistor MP5 and the second bias circuit.

In the output stage circuit 350, the source terminal of the first output transistor MPO can be connected to the first voltage rail and the drain terminal can be connected to the output side OT. The gate terminal HIP of the first output transistor MPO can be connected to a contact node between the second bias circuit and the first current mirror circuit 331 in the mirroring current path.

In the output stage circuit 350, the source terminal of the second output transistor MNO can be connected to the second voltage rail and the drain terminal can be connected to the output side OT. The gate terminal HIN of the second output transistor MNO can be connected to a contact node between the second bias circuit and the second current minor circuit 332 in the mirroring current path.

The input circuit stage 320 can generate differential currents according to the differential input voltages IP and IM. The current minor circuit stages 331 and 332 can control the gate terminals of the first output transistor MPO and the second output transistor MNO according to the differential currents.

The boosting circuit stage 310 can supply additional dynamic current to the input circuit stage 320 or can supply additional dynamic current to the current mirror circuit stage 331 and 332 in response to changes in the differential input voltages IP and IM, so that the slew rate of the differential amplifier 300 can be improved.

The boosting circuit stage 310 can supply dynamic current to the first current mirror circuit 331 or supply the dynamic current to the second current mirror circuit 332 according to the polarity of the differential voltage between the differential input voltages IP and IM.

Meanwhile, the boosting circuit stage 310 can additionally supply another dynamic current to the input circuit stage 320 in response to changes in the differential input voltages IP and IM. The dynamic current supplied to the input circuit stage 320 can be different from the dynamic current supplied to the first current mirror circuit 331 or the second current mirror circuit 332, but is not limited thereto.

The boosting circuit stage 310 can supply dynamic current to the input circuit stage 320. The input circuit stage 320 can comprise differential amplification circuits that have a common source structure and input differential input voltages IP and IM to the gate terminals. The boosting circuit stage 310 can supply dynamic current to the common source terminals CSP and CSN of the differential amplification circuits. For example, the boosting circuit stage 310 can supply dynamic current to the common source terminal CSN of the first differential amplification circuit, or can supply dynamic current to the common source terminal CSP of the second differential amplification circuit.

The boosting circuit stage 310 can supply dynamic current to the current mirror circuit stages 331 and 332. The current mirror circuit stages 331 and 332 can comprise current mirror circuits 331 and 332 having a common gate structure. The boosting circuit stage 310 can supply dynamic current to the common gate terminals HPC and HPN of the current mirror circuits 331 and 332. For example, the boosting circuit stage 310 can supply dynamic current to the common gate terminal HPC of the first current mirror circuit 331 or supply dynamic current to the common gate terminal HNC of the second current mirror circuit 332.

The current mirror circuit stages 331 and 332 can comprise a reference current path through which a reference current flows and a mirroring current path through which a mirroring current flows. The boosting circuit stage 310 can supply dynamic current to the reference current path. For example, the boosting circuit stage 320 can supply dynamic current to the common gate terminal HPC of the first current minor circuit 331, and this dynamic current can flow into the reference current path through the drain terminal of the first reference current transistor MP4. As another example, the boosting circuit stage 320 can supply dynamic current to the common gate terminal HNC of the second current minor circuit 332, and this dynamic current can flow into the reference current path through the drain terminal of the second reference current transistor MN4.

Figure 4:
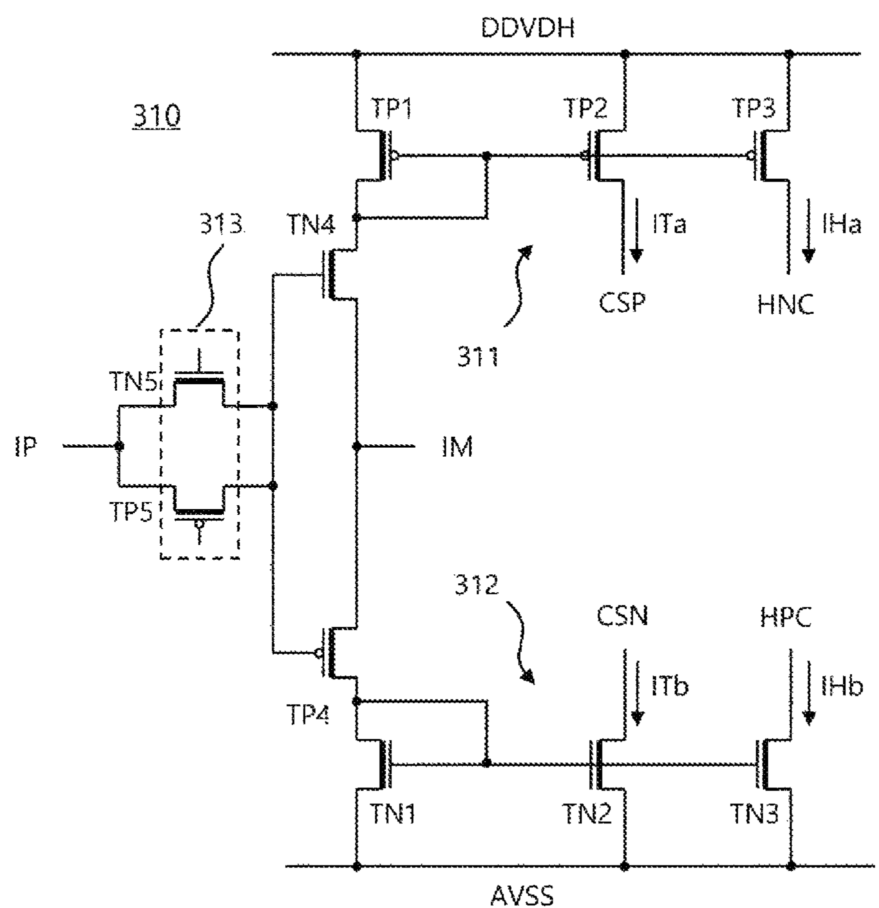
FIG. 4 is a configuration diagram of a boosting circuit according to an embodiment.

FIG. 4 is a configuration diagram of a boosting circuit according to an embodiment.

Referring to FIG. 4, the boosting circuit stage 310 can comprise a first comparison transistor TN4 and a second comparison transistor TP4. The gate terminal of each of the first comparison transistor TN4 and the second comparison transistor TP4 can be connected to a line of the first differential input voltage IP, and the source terminal each of the first comparison transistor TN4 and the second comparison transistor TP4 can be connected to a line of the second differential input voltage IM.

The boosting circuit stage 310 can generate and supply dynamic current according to the current flowing through the first comparison transistor TN4 and the second comparison transistor TP4.

The first comparison transistor TN4 can be an N-type transistor. If the first differential input voltage IP and the second differential input voltage IM maintain similar voltage levels, current may not flow through the first comparison transistor TN4. Then, when the first differential input voltage IP rises—has a rising waveform—current can flow to the first comparison transistor TN4. The first comparison transistor TN4 can be connected to the first mirror circuit 311. The boosting circuit stage 310 can minor the current flowing in the first comparison transistor TN4 through the first mirror circuit 311, and supply the mirrored currents ITa and IHa to the common source terminal CSP of the second differential amplification circuit and/or the common gate terminal HNC of the second current mirror circuit 332.

In the first mirror circuit 311, the current flowing through the first comparison transistor TN4 can flow into the first P-type transistor TP1, and the current flowing through the first P-type transistor TP1 can be mirrored in the second P-type transistor TP2 and the third P-type transistor TP3. The current ITa flowing through the second P-type transistor TP2 can be supplied to the common source terminal CSP of the second differential amplification circuit, and the current IHa flowing through the third P-type transistor TP3 can be supplied to the common gate terminal HNC of the second current mirror circuit 332.

The second comparison transistor TP4 can be a P-type transistor. If the first differential input voltage IP and the second differential input voltage IM maintain similar voltage levels, current may not flow through the second comparison transistor TP4. Then, when the first differential input voltage IP falls—has a falling waveform—current can flow to the second comparison transistor TP4. The second comparison transistor TP4 can be connected to the second minor circuit 312. The boosting circuit stage 310 can mirror the current flowing in the second comparison transistor TP4 through the second minor circuit 312, and supply the mirrored currents ITb and IHb to the common source terminal CSN of the first differential amplification circuit and/or the common gate terminal HPC of the first current minor circuit 331.

In the second mirror circuit 312, the current flowing through the second comparison transistor TP4 can flow into the first N-type transistor TN1, and the current flowing through the first N-type transistor TN1 can be mirrored in the second N-type transistor TN2 and the third N-type transistor TN3. The current ITb flowing through the second N-type transistor TN2 can be supplied to the common source terminal CSN of the first differential amplification circuit, and the current IHb flowing through the third N-type transistor TN3 can be supplied to the common gate terminal HPC of the first current mirror circuit 331.

The boosting circuit stage 310 can comprise a toggle circuit 313 in which an N-type transistor TN5 and a P-type transistor TP5 are connected in parallel. The toggle circuit 313 can be disposed between the terminal where the first differential input voltage IP is input and the gate terminals of the comparison transistors TN4 and TP4. The boosting circuit stage 310 can control the voltage supplied to the gate terminal of the toggle circuit 313 to turn off the toggle circuit 313, thereby preventing dynamic current from being supplied.

Figure 5:
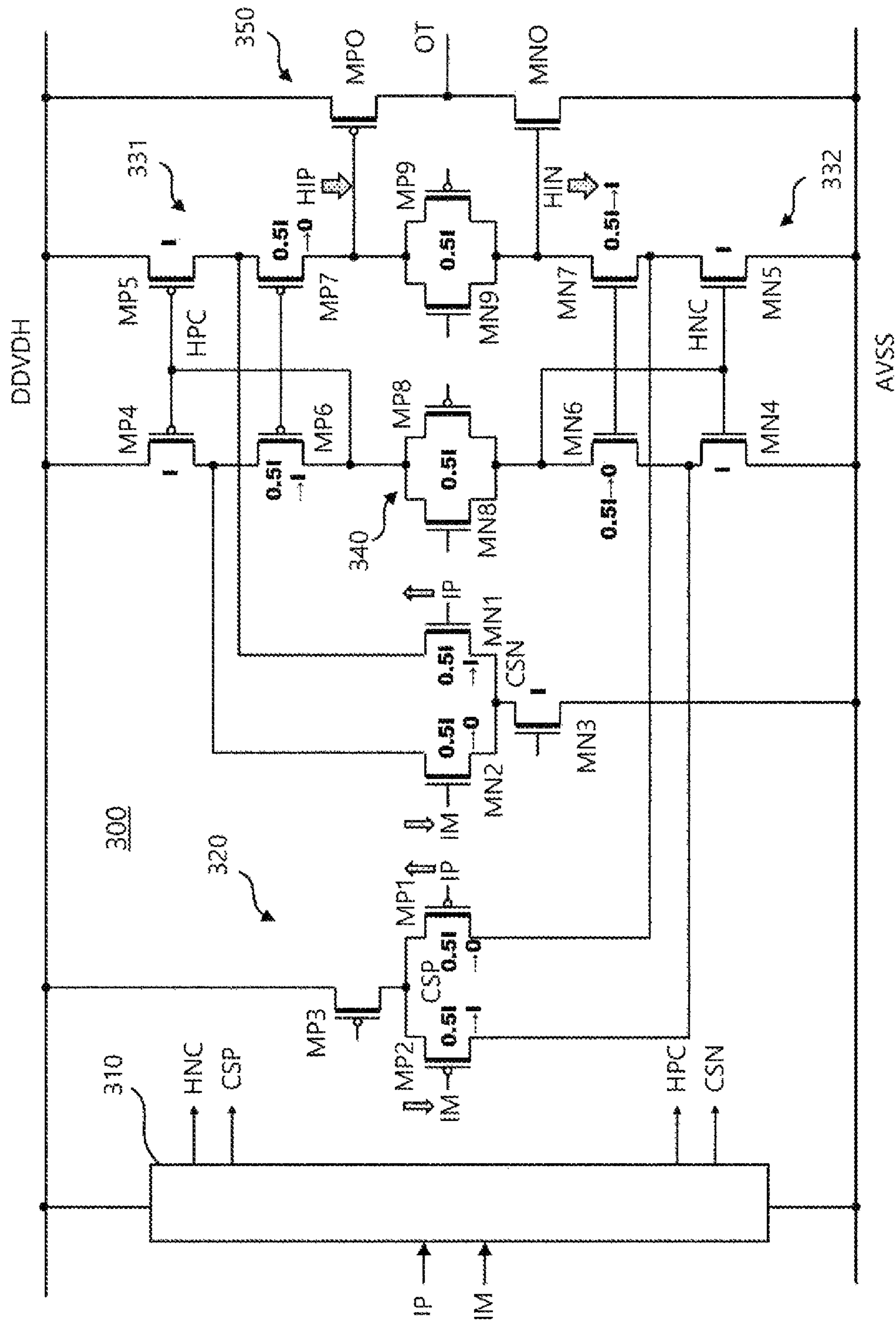
FIG. 5 is a diagram showing a current state of the differential amplifier for a rising waveform when a boosting circuit stage according to the embodiment is turned off.

FIG. 5 is a diagram showing a current state of the differential amplifier for a rising waveform when a boosting circuit stage according to the embodiment is turned off.

Referring to FIGS. 3, 4 and 5, the boosting circuit stage 310 can turn off the toggle circuit 313 to not supply dynamic current. At this time, the differential amplifier 300 can operate according to the operation method of the rail-to-rail class-AB amplifier.

When the first differential input voltage IP has a rising waveform, the current of the first N-type transistor MN1 can increase. Accordingly, the current of the first minoring current transistor MPS can flow to the first N-type transistor MN1, so that the gate terminal HIP of the first output transistor MPO can be discharged according to the second bias current generated by the second bias circuit.

When the first differential input voltage IP has a rising waveform, the current of the first P-type transistor MP1 can decrease. Accordingly, the current of the second mirroring current transistor MN5 does not flow to the first P-type transistor MP1, so that the gate terminal HIN of the second output transistor MNO can be discharged.

Figure 6:
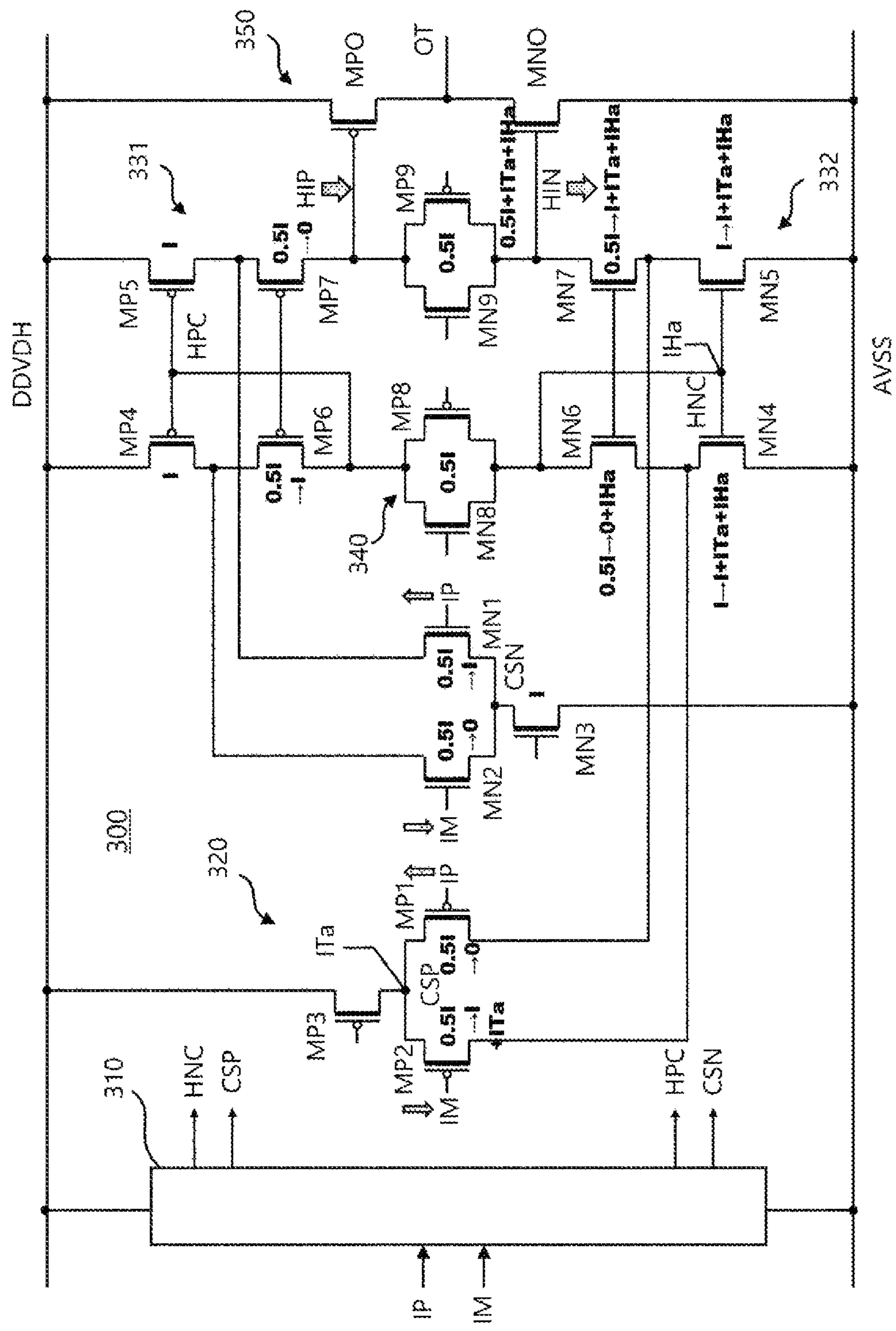

FIG. 6 is a diagram showing a current state of the differential amplifier for a rising waveform when the boosting circuit stage according to the embodiment is turned on.

Referring to FIGS. 3, 4 and 6, the boosting circuit stage 310 can supply dynamic current by turning on the toggle circuit 313.

When the first differential input voltage IP has a rising waveform, as described with reference to FIG. 4, the boosting circuit stage 310 can supply the first dynamic current ITa to the common source terminal CSP of the second differential amplification circuit, and supply the second dynamic current IHa to the common gate terminal HNC of the second current mirror circuit 332. Accordingly, the gate terminal HIN of the second output transistor MNO can be discharged with a new discharge current (second reference discharge current, FIG. 6) in which the first dynamic current ITa and the second dynamic current IHa are added to the first reference discharge current, rather than the existing discharge current (first reference discharge current, FIG. 5), so that the slew rate of the output stage circuit 350 can be improved.

Figure 7:
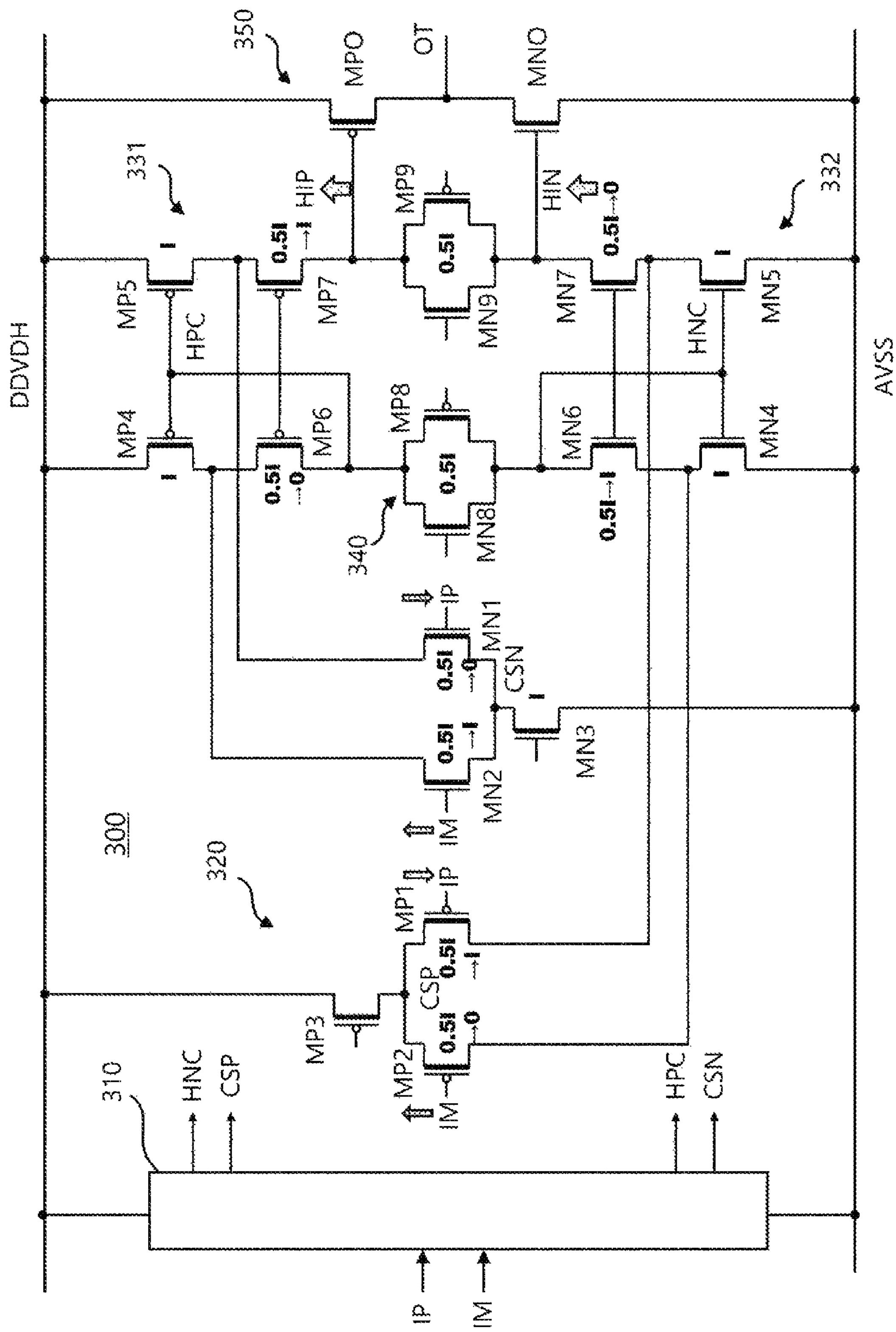
FIG. 7 is a diagram showing a current state of the differential amplifier for a falling waveform when the boosting circuit stage according to the embodiment is turned off.

FIG. 7 is a diagram showing a current state of the differential amplifier for a falling waveform when the boosting circuit stage according to the embodiment is turned off.

Referring to FIGS. 3, 4 and 7, the boosting circuit stage 310 can turn off the toggle circuit 313 to not supply dynamic current. At this time, the differential amplifier 300 can operate according to the operation method of the rail-to-rail class-AB amplifier.

When the first differential input voltage IP has a falling waveform, the current of the first N-type transistor MN1 can decrease. Accordingly, the current of the first mirroring current transistor MPS does not flow to the first N-type transistor MN1, so that the gate terminal HIP of the first output transistor MPO can be charged.

When the first differential input voltage IP has a falling waveform, the current of the first P-type transistor MP1 can increase. Accordingly, the current of the second mirroring current transistor MN5 can flow into the first P-type transistor MP1, so that the gate terminal HIN of the second output transistor MNO can be charged according to the second bias current generated by the second bias circuit.

Figure 8:
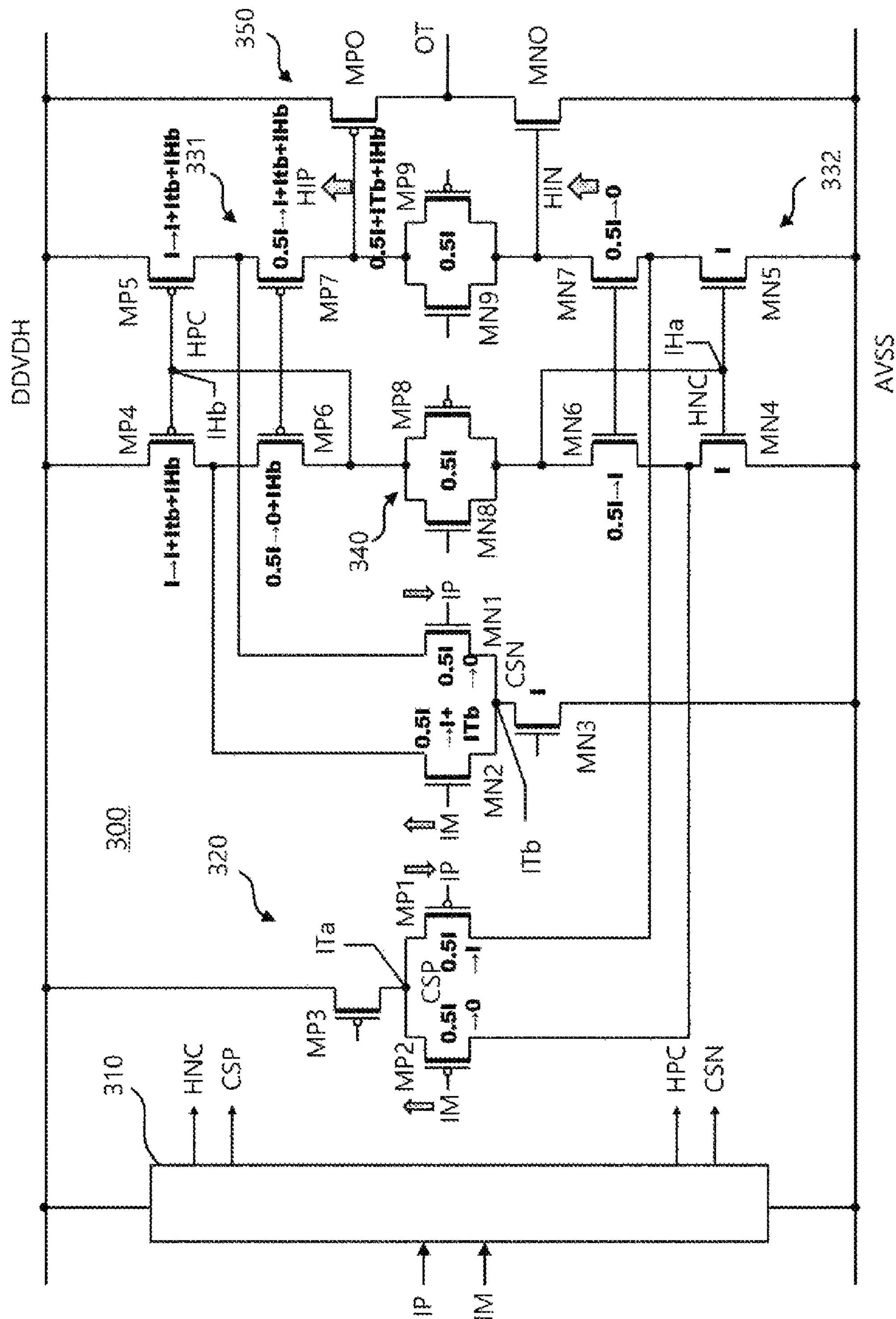

FIG. 8 is a diagram showing a current state of the differential amplifier for the falling waveform when the boosting circuit stage according to the embodiment is turned on.

Referring to FIGS. 3, 4 and 8, the boosting circuit stage 310 can supply dynamic current by turning on the toggle circuit 313.

When the first differential input voltage IP has a falling waveform, as described with reference to FIG. 4, the boosting circuit stage 310 can supply the third dynamic current ITb to the common source terminal CSN of the first differential amplification circuit, and supply the fourth dynamic current IHb to the common gate terminal HPC of the first current mirror circuit 331. Accordingly, the gate terminal HIP of the first output transistor MPO can charged with a new charging current (second reference charging current, FIG. 8) in which the third dynamic current ITb and the fourth dynamic current IHb are added to the first reference charging current, rather than the existing charging current (first reference charging current, FIG. 7), so that the slew rate of the output stage circuit 350 can be improved.

As described above, according to the embodiment, the response characteristics of the display panel can be improved through improvements to the data driving device. According to an embodiment, the slew rate of a differential amplifier that can be used in a data driving device can be improved. According to an embodiment, a differential amplifier having a high-speed slew rate can be provided without adding static power. According to an embodiment, a differential amplifier can be provided in which the phenomenon of overshooting and undershooting is improved in the range of linear operation. According to an embodiment, a differential amplifier that performs an effective slew boosting function can be provided by adding a simple circuit.

What is claimed is:

1. A differential amplifier comprising:
an output circuit stage comprising a first output transistor disposed between a first voltage rail and an output side, and a second output transistor disposed between a second voltage rail and the output side;
an input circuit stage configured to generate differential currents according to differential input voltages;
a current mirror circuit stage configured to control gate terminals of the first output transistor and the second output transistor according to the differential currents; and
a boosting circuit stage configured to additionally supply dynamic current to the input circuit stage in response to changes in the differential input voltages,
wherein the boosting circuit stage comprises a comparison transistor in which a line of a first differential input voltage is connected to a gate terminal and a line of a second differential input voltage is connected to a source terminal, and
wherein the dynamic current is configured to be supplied according to current flowing in the comparison transistor.

2. The differential amplifier of claim 1, wherein
the input circuit stage comprises a differential amplification circuit having a common source structure and configured to input the differential input voltages to gate terminals, and
the boosting circuit stage is configured to supply the dynamic current to a common source terminal of the differential amplification circuit.

3. The differential amplifier of claim 2, comprising:
a bias current source configured to supply bias current to the common source terminal,
wherein the bias current source and the boosting circuit stage are configured to supply current to the common source terminal.

4. The differential amplifier of claim 1, wherein the boosting circuit is configured to generate the dynamic current by mirroring the current flowing in the comparison transistor.

5. The differential amplifier of claim 1, wherein
the boosting circuit stage comprises a toggle circuit in which an N-type transistor and a P-type transistor are connected in parallel, and
the toggle circuit is disposed between a terminal where the first differential input voltage is input and the gate terminal of the comparison transistor.

6. The differential amplifier of claim 1, wherein
the boosting circuit stage comprises another comparison transistor, and
the dynamic current is configured to be supplied according to currents flowing in the comparison transistor and said another comparison transistor.

7. A differential amplifier comprising:
an output circuit stage comprising a first output transistor disposed between a first voltage rail and an output side, and a second output transistor disposed between a second voltage rail and the output side;
an input circuit stage configured to generate differential currents according to differential input voltages;
a current mirror circuit stage configured to control gate terminals of the first output transistor and the second output transistor according to the differential currents; and
a boosting circuit stage configured to additionally supply dynamic current to the current mirror circuit stage in response to changes in the differential input voltages,
wherein the boosting circuit stage comprises a comparison transistor in which a line of a first differential input voltage is connected to a gate terminal and a line of a second differential input voltage is connected to a source terminal, and
wherein the dynamic current is configured to be supplied according to current flowing in the comparison transistor.

8. The differential amplifier of claim 7, wherein
the current mirror circuit stage comprises a reference current path through which a reference current flows and a mirroring current path through which a mirroring current flows, and
the boosting circuit stage is configured to supply the dynamic current to the reference current path.

9. The differential amplifier of claim 7, wherein
the current mirror circuit stage comprises a current mirror circuit having a common gate structure, and
the boosting circuit stage is configured to supply the dynamic current to a common gate terminal of the current mirror circuit.

10. The differential amplifier of claim 7, wherein the current mirror circuit stage comprises a first current mirror circuit connected to the first voltage rail that supplies a first driving voltage and a second current mirror circuit connected to the second voltage rail that supplies a second driving voltage, and the boosting circuit stage is configured to supply the dynamic current to the first current mirror circuit or supply the dynamic current to the second current mirror circuit according to the polarity of a differential voltage between the differential input voltages.

11. The differential amplifier of claim 7, wherein the boosting circuit stage is configured to additionally supply another dynamic current to the input circuit stage in response to changes in the differential input voltages.

12. The differential amplifier of claim 7, wherein the boosting circuit is configured to generate the dynamic current by mirroring the current flowing in the comparison transistor.

13. A data driving device comprising:

a latch circuit configured to latch pixel data comprising grayscale values for pixels;

a digital-to-analog converter configured to convert a digital signal corresponding to the pixel data into an analog voltage; and a buffer circuit comprising a rail-to-rail class-AB type amplifier, and configured to supply to a pixel a data voltage obtained by amplifying the analog voltage using the amplifier, and additionally supply dynamic current to an input circuit stage or a current mirror circuit stage of the amplifier in response to changes in the analog voltage, wherein the boosting circuit stage comprises a comparison transistor in which a line of a first differential input voltage is connected to a gate terminal and a line of a second differential input voltage is connected to a source terminal, and wherein the dynamic current is configured to be supplied according to current flowing in the comparison transistor.

14. The data driving device of claim 13, comprising:

a level shifter configured to increase a signal level while converting the pixel data into the digital signal.

15. The data driving device of claim 13, wherein the output side of the amplifier is connected to an inverting input terminal of the amplifier, and the analog voltage is configured to be supplied to a non-inverting input terminal of the amplifier.

16. The data driving device of claim 13, wherein the current mirror circuit stage comprises a first current mirror circuit connected to a first voltage rail configured to supply a first driving voltage and a second current mirror circuit connected to a second voltage rail configured to supply a second driving voltage, and the buffer circuit is configured to supply the dynamic current to the second current mirror circuit when the analog voltage has a rising waveform, and supply the dynamic current to the first current mirror circuit when the analog voltage has a falling waveform.

17. The data driving device of claim 13, wherein the input circuit stage comprises a differential amplification circuit having a common source structure and configured to input differential input voltages of the amplifier to gate terminals, and the buffer circuit is configured to supply the dynamic current to a common source terminal of the differential amplification circuit.

18. The data driving device of claim 13, wherein the current mirror circuit stage comprises a current mirror circuit having a common gate structure, and the buffer circuit is configured to supply the dynamic current to a common gate terminal of the current mirror circuit.

* * * * *